(12) United States Patent
Chen et al.

(10) Patent No.: US 8,395,923 B2
(45) Date of Patent: Mar. 12, 2013

(54) ANTIFUSE PROGRAMMABLE MEMORY ARRAY

(75) Inventors: Zhanping Chen, Portland, OR (US); Sarvesh H. Kulkarni, Hillsboro, OR (US); Kevin Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 362 days.

(21) Appl. No.: 12/639,446

(22) Filed: Dec. 16, 2009

(65) Prior Publication Data

US 2010/0165699 A1 Jul. 1, 2010

Related U.S. Application Data

(63) Continuation-in-part of application No. 12/319,104, filed on Dec. 30, 2008, now Pat. No. 8,101,471.

(51) Int. Cl.
G11C 17/00 (2006.01)
G11C 7/00 (2006.01)
G11C 17/18 (2006.01)
G11C 5/14 (2006.01)

(52) U.S. Cl. ............ 365/94; 365/96; 365/102; 365/103; 365/104; 365/189.11; 365/225.7; 365/226

(58) Field of Classification Search .................... 365/94, 365/96, 102, 103, 104, 174, 189.09, 189.11, 365/225.7, 226
See application file for complete search history.

(56) References Cited

U.S. PATENT DOCUMENTS

| | | | | |
|---|---|---|---|---|
| 4,872,140 A | * | 10/1989 | Graham et al. | ............ 365/225.7 |
| 6,018,475 A | * | 1/2000 | Papadas et al. | ................ 365/174 |
| 6,088,282 A | * | 7/2000 | Loughmiller et al. | ..... 365/225.7 |
| 6,345,001 B1 | | 2/2002 | Mokhlesi | |
| 6,545,898 B1 | * | 4/2003 | Scheuerlein | ..................... 365/94 |
| 6,617,914 B1 | * | 9/2003 | Kothandaraman | ......... 365/225.7 |
| 6,816,427 B2 | * | 11/2004 | Novosel et al. | ............ 365/225.7 |
| 6,928,021 B2 | * | 8/2005 | Pecheyran et al. | ......... 365/225.7 |
| 7,167,397 B2 | * | 1/2007 | Paillet et al. | ............... 365/225.7 |
| 7,269,081 B2 | * | 9/2007 | Ito | ..................................... 365/94 |
| 7,277,347 B2 | * | 10/2007 | Jenne | ......................... 365/225.7 |
| 7,321,502 B2 | * | 1/2008 | Paillet et al. | ..................... 365/94 |
| 7,369,452 B2 | * | 5/2008 | Kenkare et al. | ............ 365/225.7 |
| 7,529,148 B2 | * | 5/2009 | Shah et al. | ................. 365/225.7 |
| 7,532,496 B1 | * | 5/2009 | Bu | ................................... 365/94 |

(Continued)

FOREIGN PATENT DOCUMENTS

| JP | 2000-123592 A1 | 4/2000 |
|---|---|---|
| JP | 2004509404 A | 3/2004 |

(Continued)

OTHER PUBLICATIONS

International Search Report and Written Opinion received for PCT Application No. PCT/US2010/054919, Mailed on Jun. 15, 2011, 11 pages

(Continued)

*Primary Examiner* — Trong Phan
(74) *Attorney, Agent, or Firm* — Finch and Maloney PLLC (57) ABSTRACT

Techniques and circuitry are disclosed for efficiently implementing programmable memory array circuit architectures, such as PROM, OTPROM, and other such programmable non-volatile memories. The circuitry employs an antifuse scheme that includes an array of memory bitcells, each containing a program device and an antifuse element configured with current path isolation well and for storing the memory cell state. The bitcell configuration, which can be used in conjunction with column/row select circuitry, power selector circuitry, and/or readout circuitry, allows for high-density memory array circuit designs and layouts.

23 Claims, 8 Drawing Sheets

U.S. PATENT DOCUMENTS

| | | | |
|---|---|---|---|
| 7,609,539 B2 * | 10/2009 | Peng et al. | 365/96 |
| 7,715,247 B2 * | 5/2010 | Kim | 365/104 |
| 8,027,207 B2 * | 9/2011 | Fifield et al. | 365/225.7 |
| 8,089,821 B2 * | 1/2012 | Schmitt et al. | 365/225.7 |
| 2005/0226078 A1 | 10/2005 | Ito et al. | |
| 2006/0092742 A1 | 5/2006 | Paillet et al. | |
| 2006/0193163 A1 | 8/2006 | Ito | |
| 2007/0058473 A1 | 3/2007 | Kouchi et al. | |
| 2007/0076463 A1 | 4/2007 | Keshavarzi et al. | |
| 2008/0237673 A1 | 10/2008 | Wada et al. | |
| 2009/0080232 A1 | 3/2009 | Chen | |
| 2009/0207650 A1 | 8/2009 | Braceras | |
| 2009/0207655 A1 | 8/2009 | Kalnitsky | |

FOREIGN PATENT DOCUMENTS

| | | |
|---|---|---|
| JP | 2005302091 A | 10/2005 |
| JP | 2006236511 A | 9/2006 |
| JP | 2008091451 A | 4/2008 |
| WO | 0223552 A | 3/2002 |
| WO | 2011/084215 A1 | 7/2011 |

OTHER PUBLICATIONS

Office Action from corresponding application in Japan 2012-502328, mailed Nov. 13, 2012. 8 pages.

* cited by examiner

ANTIFUSE PROGRAMMABLE MEMORY ARRAY

RELATED APPLICATION

This application is a continuation-in-part of U.S. application Ser. No. 12/319,104 filed Dec. 30, 2008, which is herein incorporated by reference in its entirety.

FIELD OF THE DISCLOSURE

The present disclosure relates to memory circuits, and more particularly, to integrated antifuse programmable memory.

BACKGROUND

Programmable memory devices such as programmable read-only memory (PROM) and one-time programmable read-only memory (OTPROM) are typically programmed by either destroying links (via a fuse) or creating links (via an antifuse) within the memory circuit. In PROMs, for instance, each memory location or bit contains a fuse and/or an antifuse, and is programmed by triggering one of the two. Once programming is performed, it is generally irreversible. The programming is usually done after manufacturing of the memory device, and with a particular end-use or application in mind.

Fuse links are commonly implemented with resistive fuse elements that can be open-circuited or 'blown' with an appropriate amount of high-current. Antifuse links, on the other hand, are implemented with a thin barrier layer of non-conducting material (such as silicon dioxide) between two conductor layers or terminals, such that when a sufficiently high voltage is applied across the terminals, the silicon dioxide or other such non-conducting material is effectively turned into a short-circuit or otherwise low resistance conductive path between the two terminals.

Conventional fuse and antifuse links for use in programming memory are associated with a number of problems, including a number of non-trivial design and layout considerations.

DETAILED DESCRIPTION

Techniques and circuitry are disclosed for efficiently implementing programmable memory array circuit architectures, such as PROM, OTPROM, and other such programmable non-volatile memories. The circuitry employs an antifuse scheme that includes an array of memory bitcells, each containing a program device and an antifuse element for storing the memory cell state. The bitcell configuration, which can be used in conjunction with column/row select circuitry, power selector circuitry, and/or readout circuitry, allows for high-density memory array circuit designs and layouts. The techniques can be embodied, for example, in discrete memory devices (e.g., non-volatile memory chips), integrated system designs (e.g., purpose-built silicon), or on-chip memory (e.g., microprocessor with on-chip non-volatile cache).

General Overview

The techniques disclosed herein allow for building high-density non-volatile memory arrays using antifuse technology. Antifuse technology has a number of benefits over conventional fuse technology, and when employed as described herein, allows for simplification of bitcells and peripheral circuitry.

For instance, programming of antifuse elements requires only a relatively high-voltage difference across a capacitor or other suitable antifuse element, which is in contrast to fuse-based technology which depends on high-current. Thus, using antifuses instead of fuses leads to reduced current delivery requirements and associated IR drops. In addition, the elimination of high current further allows for better yield due to potentially reduced row dependence, as well as test time reduction via multi-bit programming.

Normally, high-voltages used to program an antifuse give rise to a unique set of design problems, particularly with respect to damaging peripheral componentry that is exposed to the high-voltage. In addition, conventional antifuse bitcells are associated with problems, such as unintended leakage of the sense current signal to the common bulk of the bitcell (such as the substrate). However, the techniques disclosed herein address such problems, and allow the bitcells to use smaller access transistors which effectively leads to reduced overall die area of the memory device.

In more detail, and in accordance with one example embodiment, a programmable ROM device includes an array of rows/columns of antifuse bitcells and peripheral circuits, wherein each column has rows of antifuse bitcells, a column selector, a power selector circuit, and sense circuitry. Each bitcell may include, for example, one thick gate PMOS programming transistor and one programmable antifuse element (i.e., a two element bitcell). The antifuse element may be realized, for example, utilizing the gate oxide of logic or analog thin gate NMOS transistors. The sense circuitry generally allows for readout of a bitcell or groups of bitcells. Row and column decoding logic circuits allows selection of particular bitcells for programming or readout. Level shifters can be provided at voltage domain boundaries, for adjusting voltage levels between nominal and high voltages.

The antifuse-based programmable memories described herein can be used in numerous applications, such as discrete memory devices as well as in microprocessors or other on-chip programmable memory applications, where the programmable nature enables functions such as cache repair, post-silicon circuit trimming/tuning, code storage, and security applications such as on-chip encryption key storage. Other suitable applications will be apparent in light of this disclosure, due to lower physical damage rates enabled by the antifuse bitcell configuration or overall array design.

Memory Device Architecture

Figure 1A:
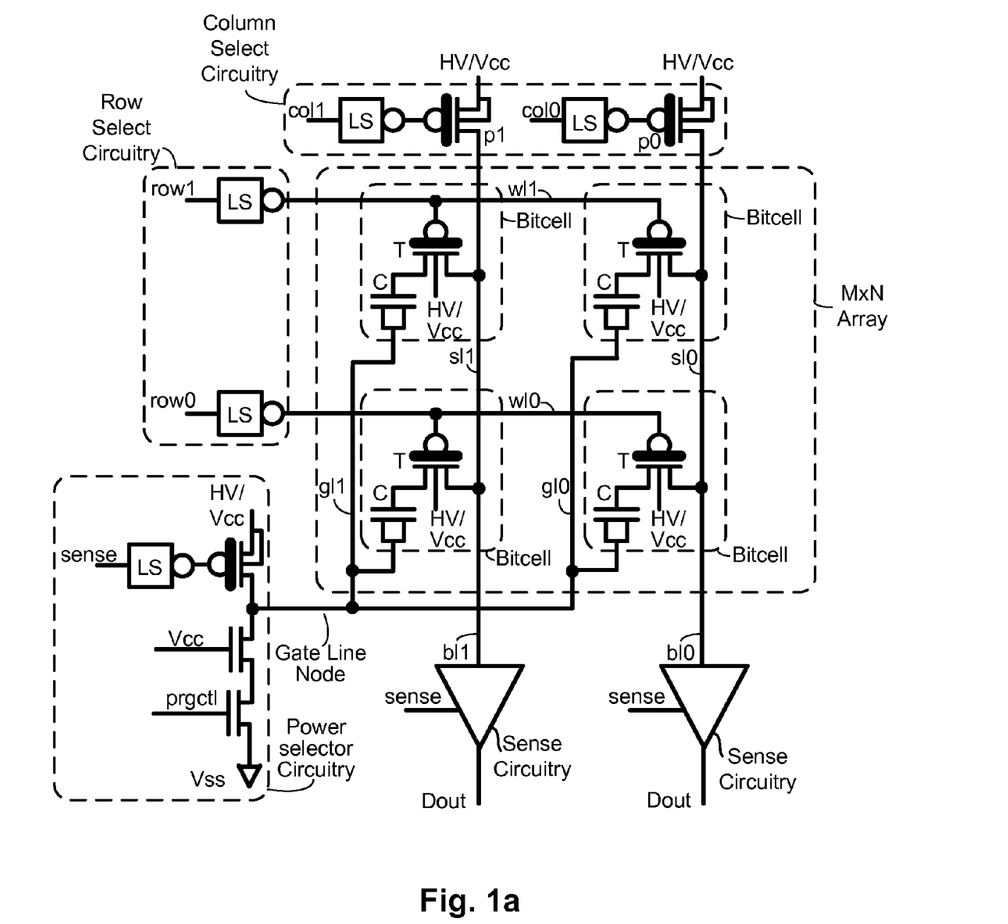
FIG. 1a illustrates an antifuse memory device configured in accordance with an embodiment of the present invention.

FIG. 1a illustrates an antifuse memory device configured in accordance with an embodiment of the present invention. As can be seen, the device includes column select circuitry, row select circuitry, power selector circuitry, and an M×N array of bitcells (only 2×2 array is shown, but M and N can be any integer values, as will be apparent in light of this disclosure. The actual array size will depend on the given application. Specific examples include a 32-row by 32-column organization, a 64-row by 64-column organization, or a 32-row by 128-column organization. Further note that the number of rows M need not match the number of columns N.

In this example configuration shown in FIG. 1a, each of the N columns share a common power selector circuit. As such, the gate lines (gl0, gl1, ..., glN−1) are connected together to effectively provide a gate line node, which is driven by the power selector circuit. One terminal of the antifuse element C in each bitcell of a column is connected to a corresponding gate line. The power selector circuit, which in this example embodiment includes a thick gate PMOS transistor and two thick gate NMOS transistors serially connected, is configured to provide one of two voltages on the gate line node. In the example shown, these two voltages effectively are Vss (e.g., 0V) during programming, or Vcc (e.g., 1.1V) after programming. Note that after programming the device, the high-voltage nodes generally designated HV in the figures can be tied to Vcc or other appropriate nominal voltage supply (i.e., high voltage supply would no longer be needed after programming), if so desired. The gate of the PMOS transistor is driven by a logic signal, sense, which is adjusted and inverted by a level shifter LS configured to interface the nominal voltage domain (e.g., Vss to Vcc, such as 0 to 1.1V) with the high-voltage domain (e.g., Vss to HV, such as 0 to 4V). The gate of the top NMOS transistor of the power selector circuit is connected to Vcc, and the gate of the bottom NMOS transistor is driven by a logic signal, prgctl. The output of the power selector circuit is taken at the drain of the PMOS transistor.

Table 1 illustrates the output of the power selector circuit given the state of its input logic signals, sense and prgctl, in accordance with one example embodiment of the present invention. For this example configuration, assume a logic low equals 0V, a logic high equals 1.1V, Vcc equals 1.1V, Vss equals 0V, and HV=4V. Note, however, that any suitable power/logic schemes can be used and the claimed invention is not intended to be limited to any particular one or set. Further note that reasonable tolerances may be applied to both power and logic levels (e.g., +/−20%), as long as proper functionality can be achieved within those tolerances.

TABLE 1

| Power Selector Logic/Output | | |
| --- | --- | --- |
| sense | prgctl | output to common gate line node |
| low | low | don't care |
| low | high | Vss |

TABLE 1-continued

| Power Selector Logic/Output | | |
| --- | --- | --- |
| sense | prgctl | output to common gate line node |
| high | low | Vcc |
| high | high | not applicable |

Figure 6:
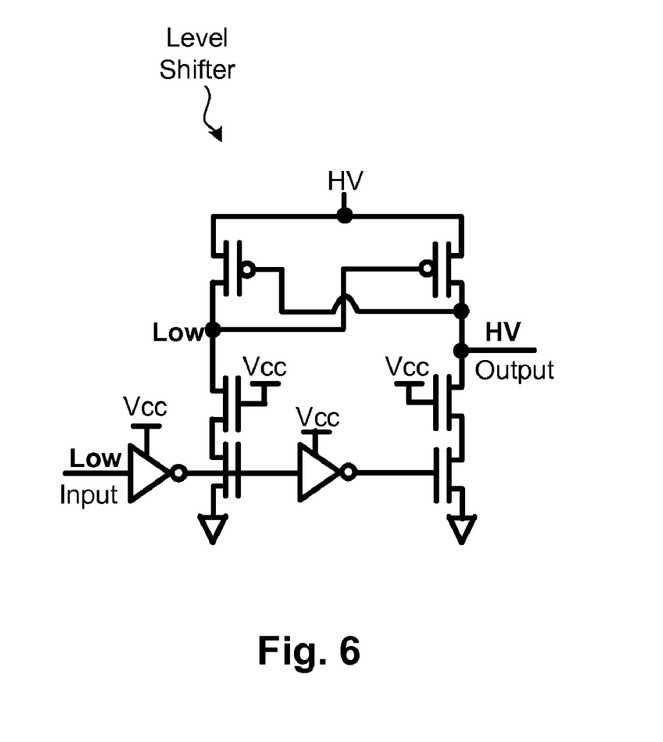
FIG. 6 illustrates an example level shifter circuit that can be used in the devices of FIGS. 1a and 1b, in accordance with an embodiment of the present invention.

Each column is associated with its own source line (sl0, sl1, ..., slN−1), and each source line is driven by a corresponding column select circuit included in the column select circuitry. In this example embodiment, each column select circuit includes a PMOS transistor (p0, p1, ..., pN) that has its gate directly driven by a level shifter LS which is directly controlled by a corresponding column signal (e.g., col0, col1, ..., colN). The level shifters can be implemented, for example, as shown in FIG. 6. As can be seen with that example level shifter circuit, a low level (0V) input signal provides a high-voltage (HV) output signal. Other suitable level shifter circuits will be apparent in light of this disclosure, and the claimed invention is not intended to be limited to any particular one; rather, any circuitry capable of converting from one voltage domain to another can be used, assuming more than one voltage domain is desirable. Table 2 illustrates the output of a level shifter given the state of its input, in accordance with one example embodiment of the present invention.

TABLE 2

| Level Shifter Logic/Output | |
| --- | --- |
| Input | Output |
| low (e.g., 0 V) | high (e.g., 4 V) |
| high (e.g., 1.1 V) | low (e.g., 0 V) |

In operation, a logic high column signal (e.g., col0, etc) causes the corresponding level shifter LS to output a logic low, which in turn cause the corresponding PMOS transistor to turn on (closed switch), effectively selecting that column for programming, as will be explained in turn. On the other hand, a logic low column signal causes the corresponding level shifter to output a logic high, which in turn cause the corresponding PMOS transistor (e.g., p0, etc) to turn off (open switch), effectively deselecting that column. With further reference to FIG. 1a, source lines (sl0, sl1, ..., slN−1) become respective bit lines (bl0, bl1, ..., blN−1), each of which is connected to its own sense circuitry. The sense circuitry will be discussed in more detail with reference to FIG. 5.

Thus, in this example embodiment of FIG. 1a, each column includes a PMOS transistor (p0, p1, etc) for column selection, M rows of bitcells, and sense circuitry. A common power selector circuit drives the common gate line node shared by all gate lines (gl0, gl1, etc). In addition, the row select circuitry of this example embodiment is implemented with M level shifters LS, which can be configured in a similar fashion to the level shifter included in the power selector and/or column select circuitries. Each level shifter is driven by a corresponding logic signal (e.g., row0, row1, ..., rowM), and outputs a corresponding word line (wl0, wl1, ..., wlM−1). The column and row select circuitries can be controlled to select specific bitcells (or groups of bitcells) for either programming (where data is written to a cell) or sensing (where data is read from a cell).

As previously explained, each bitcell of the M×N array includes a program device and an antifuse element for storing the memory cell state. In the example embodiment shown, the program device is implemented with a thick gate PMOS transistor T, and the antifuse element is implemented with a thin gate oxide capacitor C. Further details of an example bitcell will be discussed with reference to FIG. 2. In addition, details with respect to programming and reading a bitcell will be discussed with reference to FIGS. 3 and 4, respectively. To assist in that discussion, Tables 3 and 4 are provided, which demonstrate the operation of the thick gate PMOS transistors (generally depicted with a bold line at the gate) and NMOS transistor (generally depicted with a relatively thin line at the gate), respectively, in accordance with one example embodiment of the present invention. Note that other devices included in the memory device can be thick gate or thin gate. Further note that if the antifuse element C does not require a high voltage for triggering, then even the program device T in the antifuse cell can have a thin gate.

TABLE 3

Thick Gate PMOS Transistor Switching

| Gate | Switch State |
|---|---|
| low (e.g., 0 V) | On (closed) |
| high (e.g., 4 V) | Off (open) |

TABLE 4

Thin Gate NMOS Transistor Switching

| Gate | Switch State |
|---|---|
| low (e.g., 0 V) | Off (open) |
| high (e.g., 1.1 V) | On (closed) |

Figure 1B:
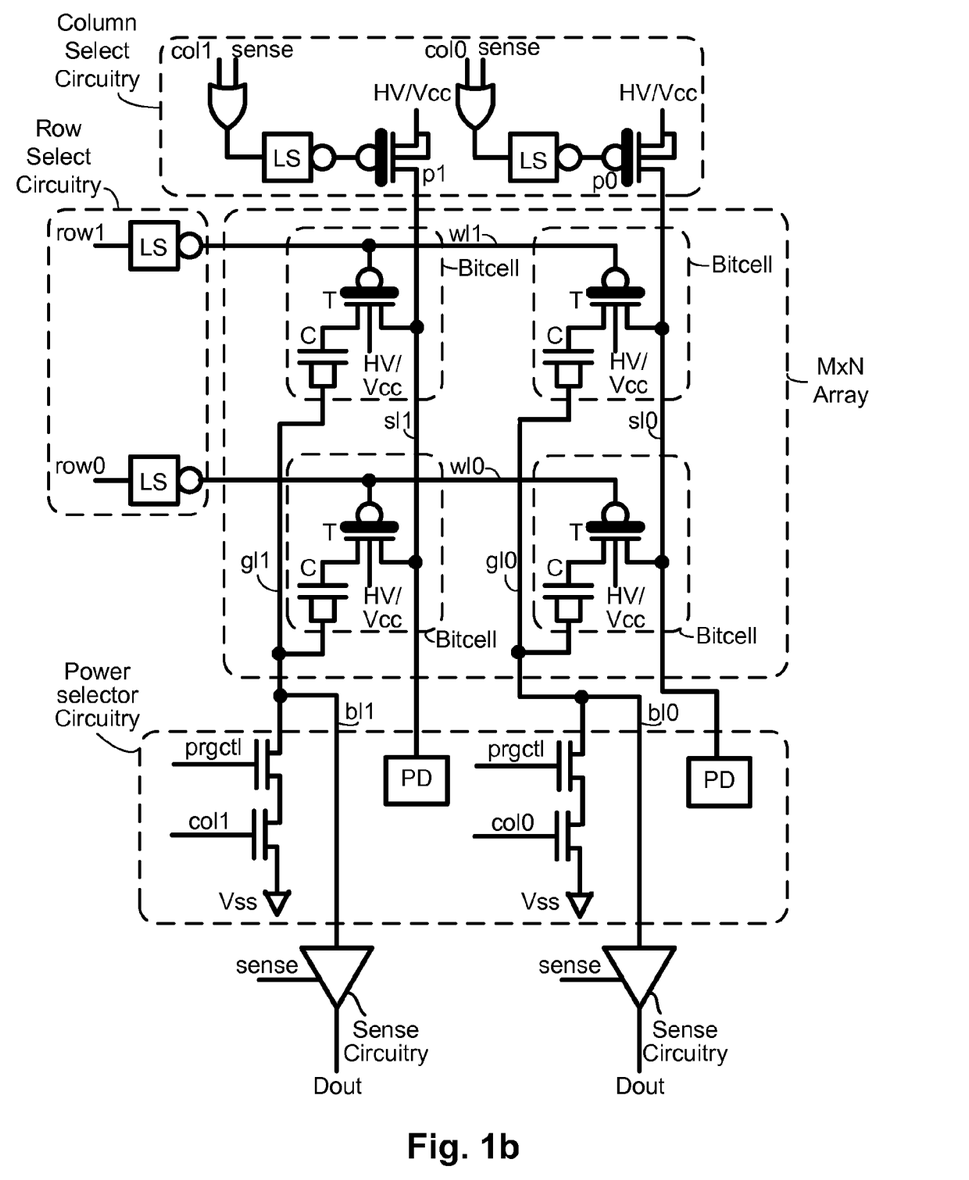
FIG. 1b illustrates an antifuse memory device configured in accordance with another embodiment of the present invention.

FIG. 1b illustrates an antifuse memory device configured in accordance with another embodiment of the present invention. The bitcells, row select circuitry, and sense circuitry can be configured and implemented in the same fashion as in the embodiment shown in FIG. 1a, and the related previous discussion is equally applicable here. However, in this alternative embodiment, each column is associated with its own power selector circuit. In more detail, each of the gate lines (gl0, gl1, . . . , glN) becomes a corresponding bit line (bl0, bl1, . . . , blN), each of which has its own sense circuitry and column select circuit. Each column select circuit is driven by a level shifter LS as previously described with reference to FIG. 1a. This embodiment in FIG. 1b further includes control circuitry for driving each level shifter. As can be seen, the control circuitry in this example embodiment is implemented with a dual input OR-gate, and the two inputs to the control circuitry are column control signal (e.g., col0, col1, etc) and a common antifuse sense signal (sense). In addition, each of the source lines (sl0, sl1, . . . , slN) connects to a pull-down circuit (PD).

Figure 7:
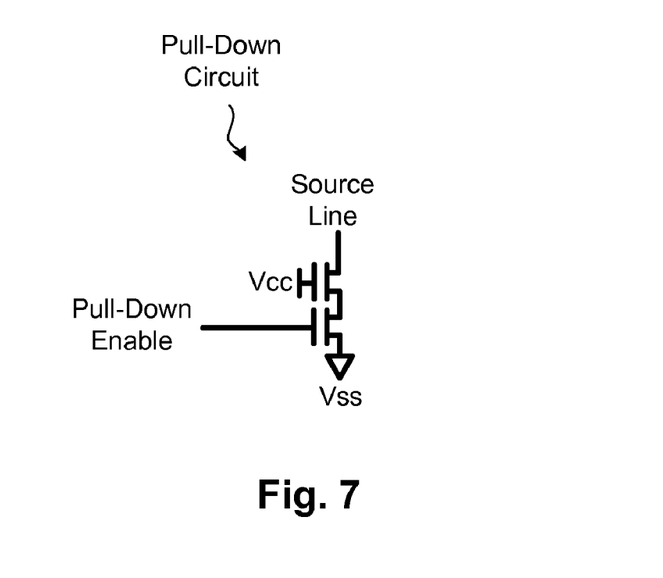
FIG. 7 illustrates an example pull-down circuit that can be used in the device of FIG. 1b, in accordance with an embodiment of the present invention.

The pull-down circuits can be implemented, for example, as shown in FIG. 7, which includes two serial gates configured as commonly done for pull-down functionality. In particular, the upper transistor essentially holds the line at some relatively high potential such as Vcc; when pull-down is enabled (e.g., when the pull-down enable signal is logic high), the lower transistor turns-on and switches in a relatively lower potential such as ground, thereby pulling down the corresponding source line (sl0, sl1, etc). As can be seen in the particular example of FIG. 7, the pull-down circuit is enabled or effectively turned on to pull-down the corresponding source line (sl0, sl1, etc) to Vss (which is ground in this example), when pull-down enable signal is active, during programming mode. The pull-down enable signal may be a dedicated control signal, or representative of a collection of logic signals that indicate pull-down is necessary. In operation, for cells in the selected row but not the selected column, the pull-down enable signal is active thereby enabling the corresponding pull-down circuit to pull-down the corresponding source line. For cells in the selected row and the selected column, the pull-down enable signal is inactive thereby disabling the corresponding pull-down circuit. During sensing mode, the pull-down circuits are disabled. Other suitable pull-down circuits will be apparent in light of this disclosure, and the claimed invention is not intended to be limited to any particular one; rather, any circuitry capable of pulling down unselected column source lines for a selected row during programming mode, and not pulling down selected column source lines of a selected row during programming mode or any column source line during sensing mode, can be used here.

Bitcell

Figure 2:
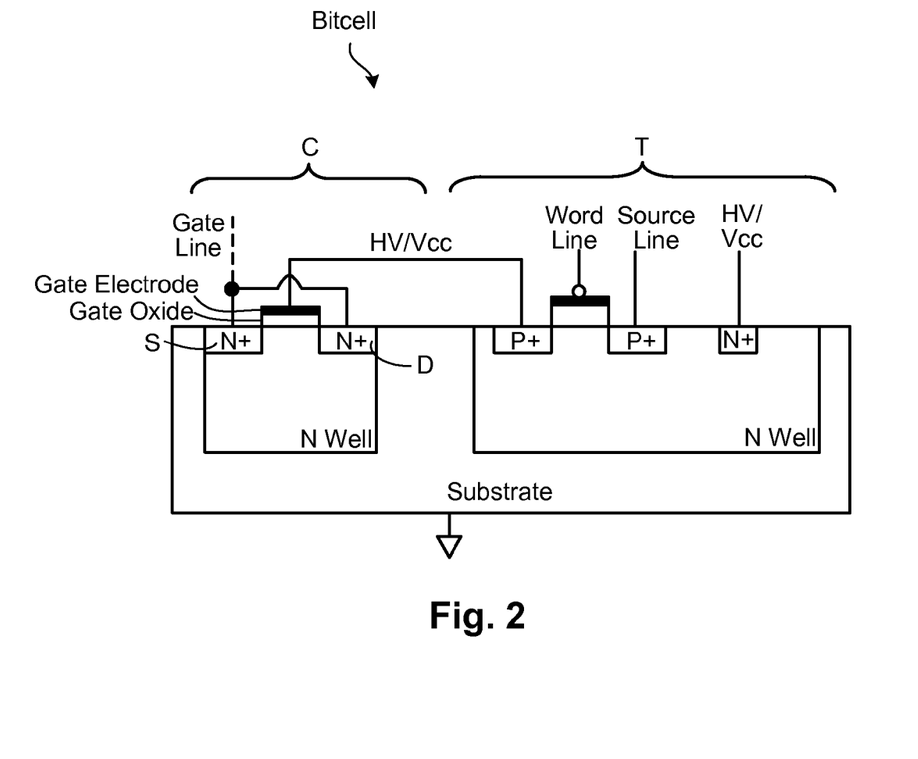
FIG. 2 illustrates an example bitcell that can be used in the devices of FIGS. 1a and 1b, configured in accordance with an embodiment of the present invention.

FIG. 2 illustrates an example bitcell that can be used in the devices of FIGS. 1a and 1b, configured in accordance with an embodiment of the present invention. As can be seen, the access element of this particular embodiment is implemented with a single access transistor T, and the antifuse element is implemented with a single gate oxide capacitor C. The antifuse element stores the bitcell state (1 or 0), and the access device provides access to the antifuse element for either programming or readout. Variations on this configuration will be apparent in light of this disclosure (such as configurations with two gate oxide capacitors C and/or two access transistors T, etc, as well as configurations implemented for non-high voltage applications).

The access transistor T can be implemented, for example, with a thick gate PMOS transistor that can withstand high-voltages. Note that if high-voltage is not needed for programming, then the access transistor T can be implemented, for example, with a thin gate PMOS transistor if so desired. The P+ regions provide the source and drain, and the N+ region provides an ohmic body tied to the N Well (if absent, the N Well would float). A number of access transistor T configurations will be apparent in light of this disclosure, and the claimed invention is not intended to be limited to any particular type (e.g., PMOS, NMOS, thin or thick gate, etc). In this example embodiment, the word line is connected to the gate, the source (or drain) is connected to the source line, and the drain (or source) is connected to the gate electrode of the antifuse element.

The antifuse element C is based on an NMOS transistor having its source and drain tied together, and may exercise a thin analog or logic gate oxide, thereby enabling a lower HV supply level necessary for device breakdown (programming). The antifuse element C of this example includes NMOS sitting in an N Well. Without an N Well, the sensing current can flow into the common bulk material without going though the sense amplifier. Given this unintended leakage, the sense amplifier is unable to compare that current with a reference current, potentially leading to an incorrect state being sensed. In contrast, for a bitcell configured with NMOS sitting in an N Well (as the example shown in FIG. 2), the post-breakdown current is contained within an N Well and can therefore be directed to the sense amplifier. By comparing the current with a reference, the sense amplifier can readout the correct state. The gate electrode of the antifuse element C is formed on the gate oxide (or other suitable gate insulator) and can be configured, for example, with an n+ polysilicon. The gate electrode is one terminal of the antifuse element (which is connected to the access device as previously explained), and the strapped source/drain forms the other terminal which is connected to the gate line.

Thus, the N Well surrounding the N+ source/drain of the antifuse capacitor C enables current path isolation and facilitates simpler sensing circuits (e.g., such as those described with reference to FIG. 5). The two sets of N Wells (associated with both devices T and C) can be shared across the entire array. This eliminates the need for multiple N Well contacts and allows area efficient bit cell layouts. For instance, and in accordance with one example embodiment, measured area of the bit cell layout is about 1.08 µm² (2.32 µm×0.464 µm), although other sizes can be implemented if so desired. Standard semiconductor processes suitable for implementing metal oxide devices (e.g., epitaxial growth, photolithograpy, chemical vapor deposition, doping, etc) can be used to fabricate the bitcell.

Thus, as will be appreciated in light of this disclosure, the bitcell structure disclosed herein may employ features from both PMOS and NMOS devices. A regular inversion mode NMOS transistor, when used as an antifuse, generally has a lower breakdown voltage (e.g., 500 to 1000 mV lower) than does a regular inversion mode PMOS transistor. As such, an NMOS transistor requires a lower programming voltage, which leads to lower oxide reliability risk on peripheral circuitry. On the other hand, NMOS transistors are susceptible to post-breakdown current leakage into the substrate, that may lead to readout inaccuracy. The example bitcell structure illustrated in FIG. 2 features the lower gate breakdown voltage of an NMOS device and the leakage containment of a PMOS device. As will further be appreciated, antifuse elements according to an embodiment of the present invention can be designed either in separate N-wells (as shown) or in common wells applied to multiple bitcells of the array (e.g., an entire row).

The post-breakdown oxide resistance of a triggered antifuse element C is generally a relatively low value, such as 10KΩ or less, whereas the pre-breakdown oxide resistance of an untriggered antifuse element C is very high (e.g., 1MΩ or higher). In one example embodiment, the pre/post resistance ratio is about 50 to 150 (e.g., 105), with an HV between 3.5V-4V (although other suitable programming voltages can be used). In a more general sense, any post-breakdown gate oxide resistance that is distinguishable relative to the pre-breakdown gate oxide resistance can be used, so as long a clear distinction between programmed and non-programmed bitcells is allowed.

Bitcell Programming

Figure 3:
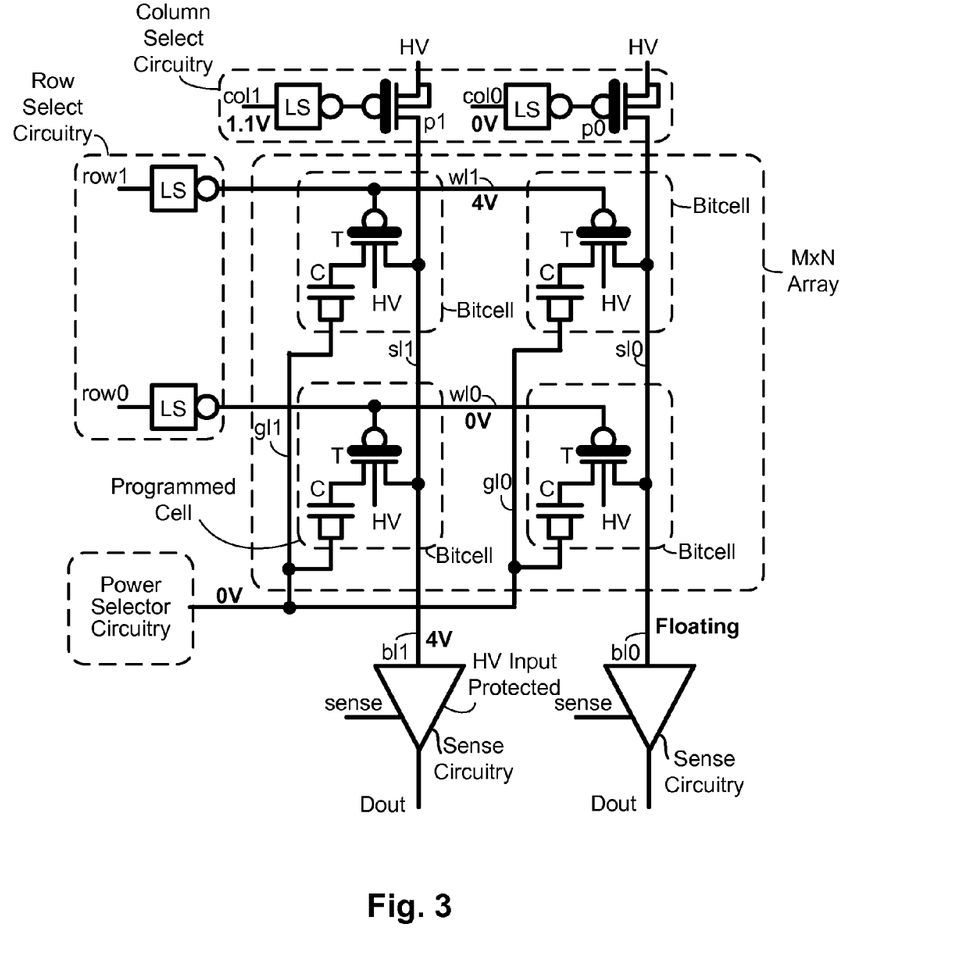
FIG. 3 illustrates an example program mode operation of a memory device configured in accordance with an embodiment of the present invention.

FIG. 3 illustrates a program mode operation of a memory device configured in accordance with an embodiment of the present invention. This particular memory device is similar to that shown in FIG. 1a.

For programming a bitcell, the respective column is first selected, via the corresponding column select circuitry. Note that all columns along a selected row can be simultaneously programmed if so desired, enabling multi-bit programming as well as test time reduction. In the example shown, col1 signal is set to logic high (1.1V, or other suitable logic high level), which is applied to the input of the corresponding level shifter LS. The output of the level shifter is logic low, which causes the corresponding PMOS transistor p1 to turn on, thereby placing a high-voltage (HV, such as 4V or other suitable high-voltage level) on the selected bit line (bl1 in the example case shown in FIG. 3). As can further be seen, column 0 is not selected in this example (col0 is set to logic low) which causes the corresponding PMOS transistor p0 to turn off. As such, the corresponding source line (sl0), which becomes bit line (bl0), is left in a floating state.

The sense signal is set to logic low (0V, or other suitable logic low level) to effectively disable sense mode. In addition, by setting the pgmctl signal to high (about 1.1V, or other suitable logic high level), the power selector circuitry is setup to drive Vss (0V or ground, in this example case) onto the gate line node (essentially a shared network in FIG. 1a), such that each of the gate lines (gl0, gl1, . . . , glN) is at 0V.

The respective row (row0 in this particular case) is then selected by setting the row0 signal to high, which causes the corresponding level shifter of that row select circuit to drive a logic low signal (e.g., 0V) onto the corresponding word line wl0. This low word line signal wl0 causes the thick gate PMOS access transistor T of that bitcell (lower left cell, generally designated as programmed cell in FIG. 3) to turn on (close), thereby allowing the HV (4V in this example) on the bl0 to be applied across the antifuse element C of that cell, which in turn causes oxide stress and eventual programming of that cell. Recall that the other side of the antifuse element C is at 0V potential, so a total of about 4V is dropped across the antifuse element for programming.

Other embodiments may use a larger or smaller potential difference, depending on factors such as the semiconductor materials with which the bitcell is made and what is needed to cause sufficient oxide stress for programming. In general, thick gate PMOS devices are able to endure about 4V (or higher) across their gate oxide for short programming intervals. However, NMOS devices (although thick gate) cannot sustain such high voltages. Hence, during programming, such NMOS devices that are exposed to HV must be protected, for example, by adopting a cascode connection, which involves additional bitcell componentry to ensure the reliability and lifetime of the array. Note that after programming the device, the high-voltage nodes can be tied to Vcc or other suitable nominal supply (i.e., high voltage would no longer be needed after programming).

Programming for the embodiment shown in FIG. 1b can be carried out in a similar fashion, but with some differences as will be appreciated in light of this disclosure. In particular, during programming, the sense signal is set to logic low (e.g., Vss or 0V) to effectively disable the sense mode, and the prgctl signal is set to logic high (e.g., Vcc or 1.1V). If the lower left cell (row0, col1) is selected for programming (as generally shown in FIG. 3), then the row0 and col1 signals are each set to logic high. These selections in turn cause a number of circuit responses.

In particular, the output of the OR-gate in the column select circuit for column 1 outputs a logic high, which is applied to the input of the corresponding level shifter LS. The output of the level shifter is low, which causes the corresponding PMOS transistor p1 to turn on, thereby placing a high-voltage (e.g., 4V or other suitable logic high voltage level) on the source line sl1. The corresponding pull-down circuit is disabled. In addition, by setting the pgmctl and col1 signals to high (e.g., 1.1V or other suitable logic high level), the power selector circuit for column 1 is setup to drive Vss (e.g., 0V or other suitable logic low level) onto the gate line gl1, which is also the bit line bl1.

Also, by setting the row0 signal to high, the corresponding level shifter drives a logic low signal (e.g., 0V) onto the corresponding word line wl0. This low word line signal wl0 causes the thick gate PMOS access transistor T of that bitcell (lower left cell, designated as programmed cell in FIG. 3) to turn on (close), thereby allowing the HV (e.g., 4V) on the sl0 to be applied across the antifuse element C of that cell, which in turn causes oxide stress and eventual programming of that cell. Recall that the other side of the antifuse element C is at 0V potential (by way of the stacked NMOS transistors of the corresponding power selector circuit), so a total of about 4V is dropped across the antifuse element to induce oxide breakdown for programming.

For cells at unselected rows, such as row 1, signal row1 is set to low (e.g., Vss), causing word line wl1 to be at high voltage level, thereby turning off the PMOS access transistors T driven by wl1, so as to inhibit antifuse programming on that row. For cells in the selected row but not the selected column, such as the lower right cell (row0, col0), the PMOS column select transistor p0 is off, due to the col0 and sense signals being low. The corresponding source line sl0 is pulled down by the corresponding pull-down circuitry. After programming, the high-voltage node can be tied to Vcc or other suitable nominal supply (i.e., high voltage would no longer be needed after programming).

Bitcell Sensing

Figure 4:
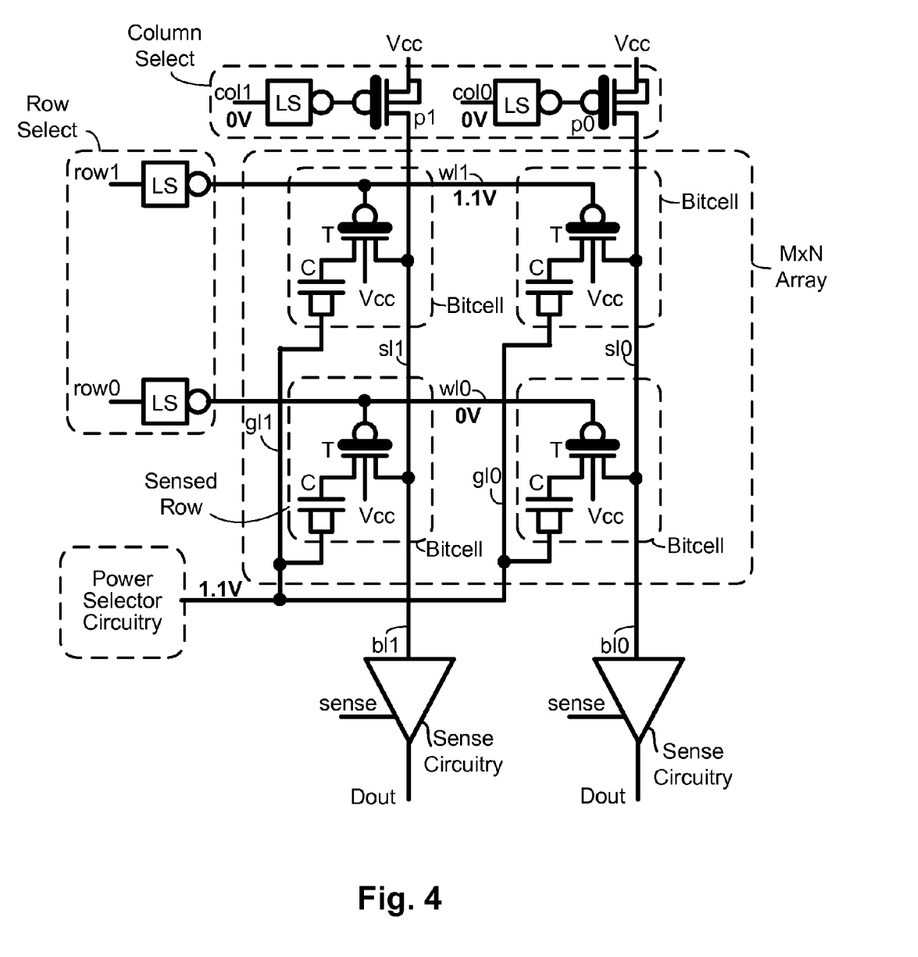
FIG. 4 illustrates an example sense mode operation of a memory device configured in accordance with an embodiment of the present invention.

FIG. 4 illustrates a sense mode operation of a memory device configured in accordance with an embodiment of the present invention. This particular memory device is similar to that shown in FIG. 1a.

For sensing, all column select PMOS devices (p0, p1, etc) of the column select circuitry are shut off by setting all column select signals (col0, col1, etc) to 0V. In this example, the high-voltage supply HV node is tied to or otherwise maintained at the nominal voltage level Vcc (e.g., 1.1V). The power selector circuit applies the nominal supply voltage level (e.g., 1.1V) on the gate line node, due to the sense signal being set to high (e.g., 1.1V) and the pgmctl signal being set to low (e.g., 0V). The desired word line (wl0, in this example) is set to low (due to row0 signal being set to high) to open all the access transistors T of the bitcells along the row. A voltage division is thus created between the antifuse capacitor resistance (pre/post breakdown resistances for unprogrammed/programmed cells, respectively) and a voltage divider within the sense circuitry, allowing for readout of the cell. During sensing, all columns along a row are sensed simultaneously.

Figure 5:
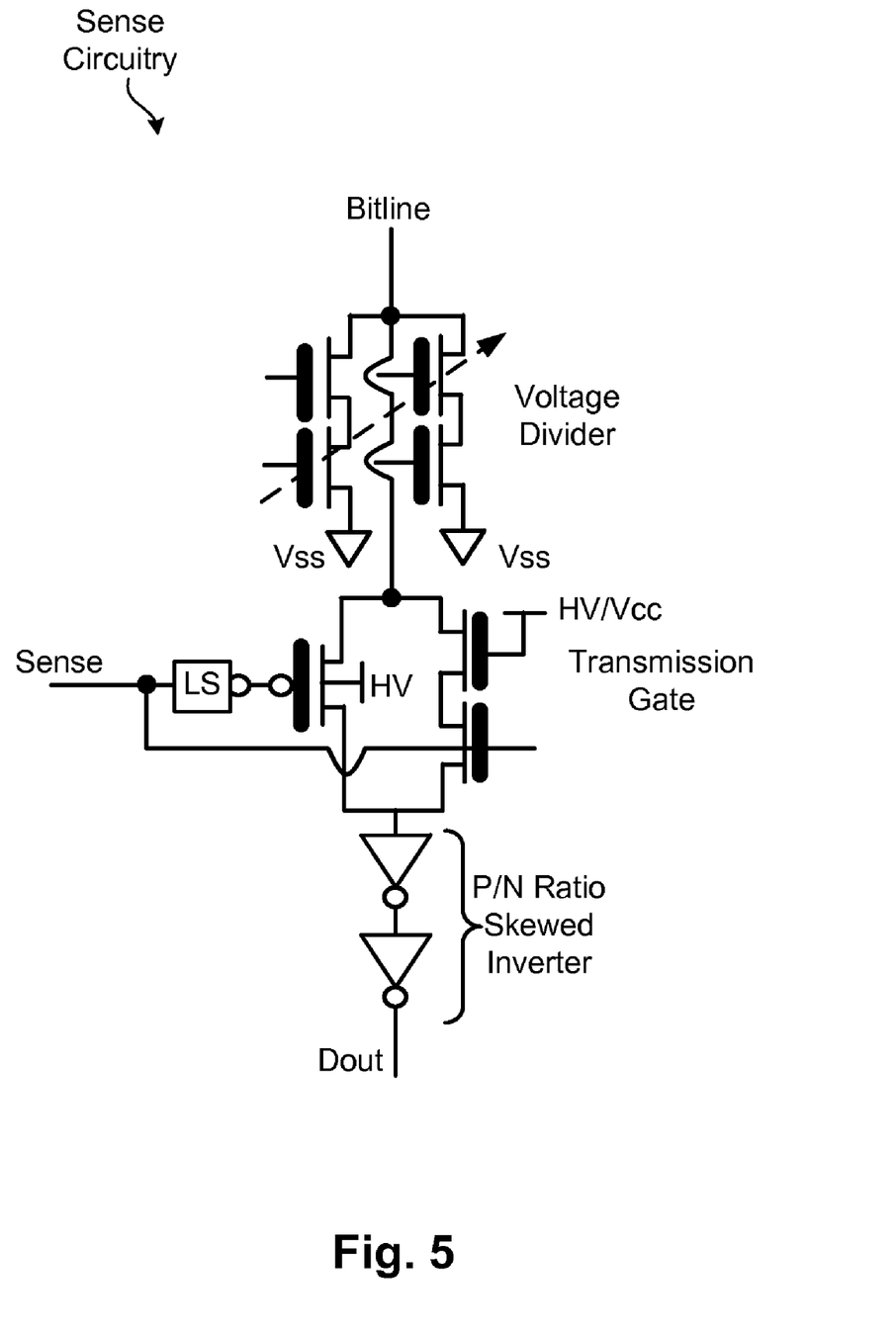
FIG. 5 illustrates example sense circuitry that can be used in the devices of FIGS. 1a and 1b, in accordance with an embodiment of the present invention.

As can be seen with the example sense amplifier configuration shown in FIG. 5, the voltage divider can be made tunable (as indicated by the dashed arrow) to facilitate process learning and margin mode measurements, as is sometimes done. This voltage divided signal is passed through a thick gate transmission gate to an analog P/N ratio skewed inverter. The transmission gate also protects downstream components such as the analog inverter from the high-voltage bit lines during programming. A logical high or low value is delivered at the output (Dout) for unprogrammed/programmed cells. The sense signal effectively enables the sense amplifier, and is provided via a level shifter in this example configuration. Any number of other suitable sense amplifiers can be used here, as will be apparent in light of this disclosure, and FIG. 5 is merely one example. For instance, the voltage divider and transmission gate are provided with thick gate transistors in this example. In other embodiments, the voltage divider and transmission gate can be thin gate construction, if so desired, given the removal of high-voltage after programming. The claimed invention is not intended to be limited to any particular sense circuit; rather, any circuitry capable of reading out a bitcell value can be used. Recall, however, that given the current path isolation surrounding the N+ source/drain of the antifuse device C (e.g., N Well in case of the example shown in FIG. 2), the readout current is generally more accurate and the sense amplifier need not be configured to calibrate for current loss to bulk material as necessitated by conventional antifuse elements.

Sensing for the embodiment shown in FIG. 1b can be carried out in a similar fashion, but with some differences as will be appreciated in light of this disclosure. During sensing, all column signals (col0, col1, etc) and the prgctl signal are set to logical low (e.g., Vss), and the sense signal is logical high (e.g., Vcc). In addition, all pull-down circuits are disabled (e.g., pull-down enable signal set to logic low). If row 0 is selected for readout (as generally shown in FIG. 4), then the row0 signal is set to logic high. These selections in turn cause a number of circuit responses.

In particular, the output of the OR-gate in each column select circuit outputs a logic high (due to sense signal being high), which is applied to the input of the corresponding level shifter LS. The output of the level shifter is low, which causes the corresponding PMOS transistor (p0, p1, etc) to turn on, thereby placing a logic high on each of the source lines (sl0, sl1, etc). Recall that the high-voltage HV node can be tied to nominal Vcc after programming is completed. Thus, Vcc is shown in the sensing example of FIG. 4, while HV is shown in the programming example of FIG. 3. So, the source lines (sl0, sl1, etc) can actually be at Vcc (e.g., 1.1V) during post-programming sensing operations. The desired word line is set to low (due to that corresponding row signal being set to high) to open all the access transistors T of the bitcells along that row. A voltage division is thus created between the antifuse capacitor resistance (pre/post breakdown resistances for unprogrammed/programmed cells, respectively) and a voltage divider within the sense circuitry, allowing for readout of the cell. During sensing, all columns along a row are sensed simultaneously. The antifuse elements can then be sensed (read) row by row, just as with the embodiment shown in FIG. 1a.

System

Figure 8:
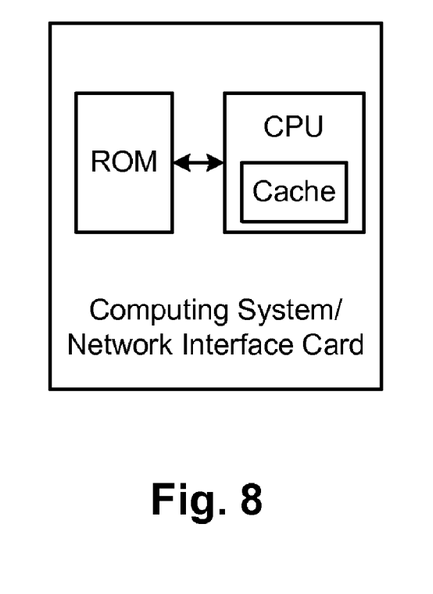
FIG. 8 illustrates a computing system configured with an antifuse memory array in accordance with an embodiment of the present invention.

FIG. 8 illustrates a system configured with an antifuse memory array in accordance with an embodiment of the present invention. The system can be, for example, a computing system (e.g., laptop or desktop computer, server, or smart phone) or a network interface card or any other system that employs non-volatile memory. As will be appreciated, memory technology effectively has an almost unlimited number of applications at the system level, and the specific system shown is merely provided as an example.

As can be seen, the system generally includes a ROM and central processing unit (CPU, or processor) configured with on-chip cache. Any suitable processor can be used, such as those provided by Intel Corporation (e.g., Intel® Core™, Pentium®, Celeron®, and Atom™ processor families). The processor can access its on-chip cache and/or the ROM and execute functionality particular to a given application, as commonly done. Each of the ROM and/or on-chip cache can be implemented as an antifuse memory device, as described herein. Other system componentry (such as display, keypad, random access memory, co-processors, bus structures, etc) are not shown, but will be apparent given the particular system application at hand.

Numerous embodiments and configurations will be apparent in light of this disclosure. For instance, one example embodiment of the present disclosure provides a memory device that includes an array of bitcells, each bitcell having two elements including a single antifuse element for storing a bitcell state and a single access element for providing access to the antifuse element for bitcell programming and readout. The device further includes power select circuitry for biasing a gate line of the array to a first voltage level for bitcell programming and a second voltage level for bitcell readout, the gate line connected to at least one of the antifuse elements. The access element can be, for example, a MOS transistor. In one specific example case, the access element is a thick gate PMOS transistor. The antifuse element can be, for example, a MOS transistor having its source and drain tied together. In one specific example case, the antifuse element is a thin gate NMOS transistor having its source and drain tied together and a gate oxide that decreases in resistance after bitcell programming. In one particular example case, post-breakdown current is inhibited from unintended leaking by a doped well of the antifuse element. In one such case, the antifuse element is an NMOS transistor having its source and drain tied together and the doped well is an N Well surrounding +N source and drain regions. In another particular example case, the N Well is shared with all bitcells within a row of the array (in other cases, each bitcell can have its own distinct N Well). The device may include, for example, at least one of column select circuitry for selecting a column of the array, row select circuitry for selecting a row of the array, and/or sense amplifier circuitry for sensing bitcell state during readout. Numerous other configurations and variations will be apparent in light of this disclosure.

For instance, another example embodiment provides a memory device that includes an array of bitcells, each bitcell having two elements including a single antifuse element for storing a bitcell state and a single access element for providing access to the antifuse element for bitcell programming and readout. The access element is a PMOS transistor and the antifuse element is an NMOS transistor having its source and drain tied together, and post-breakdown current is inhibited from unintended leaking by an N Well surrounding +N source and drain regions of the antifuse element. The access element can be, for example, a thick gate PMOS transistor, and the antifuse element can be, for instance, a thin gate NMOS transistor. In some cases, the N Well can be shared with multiple bitcells of the array. The device may include power select circuitry for biasing a gate line of the array to a first voltage level for bitcell programming and a second voltage level for bitcell readout, the gate line connected to at least one of the antifuse elements. The device may include at least one of column select circuitry for selecting a column of the array, row select circuitry for selecting a row of the array, and/or sense amplifier circuitry for sensing bitcell state during readout.

Another example embodiment of the present disclosure provides a system that includes a memory device and a processor for accessing the memory device. The memory device includes an array of bitcells, each bitcell having two elements including a single antifuse element for storing a bitcell state and a single access element for providing access to the antifuse element for bitcell programming and readout. The memory device further includes power select circuitry for biasing a gate line of the array to a first voltage level for bitcell programming and a second voltage level for bitcell readout, the gate line connected to at least one of the antifuse elements. The access element can be, for example, a MOS transistor and the antifuse element can be, for instance, a MOS transistor having its source and drain tied together. In one specific example case, the access element is a thick gate PMOS transistor. In another specific example case, the antifuse element is a thin gate NMOS transistor having its source and drain tied together and a gate oxide that decreases in resistance after bitcell programming. In one particular example case, post-breakdown current is inhibited from unintended leaking by a doped well of the antifuse element. In one such case, the antifuse element is an NMOS transistor having its source and drain tied together and the doped well is an N Well surrounding +N source and drain regions. In another particular example case, the N Well is shared with all bitcells within a row of the array. The system may include at least one of column select circuitry for selecting a column of the array, row select circuitry for selecting a row of the array, and/or sense amplifier circuitry for sensing bitcell state during readout.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. A memory device, comprising:
an array of bitcells, each bitcell having two elements including a single antifuse element for storing a bitcell state and a single access element for providing access to the antifuse element for bitcell programming and readout, wherein the antifuse element is an NMOS transistor configured with an N Well surrounding +N source and drain regions and its source and drain tied together;
power select circuitry for biasing a gate line of the array to a first voltage level for bitcell programming and a second voltage level for bitcell readout, the gate line connected to at least one of the antifuse elements; and
sense circuitry for sensing bitcell state during readout, and including a voltage divider operatively coupled to a transmission gate serially coupled to a skewed inverter, wherein during readout a voltage divided signal from the voltage divider is passed through the transmission gate to the skewed inverter and a high or low value is provided at the inverter output.

2. The memory device of claim 1 wherein the access element is a MOS transistor.

3. The memory device of claim 1 wherein the access element is a thick gate PMOS transistor, and each of the voltage divider and transmission gate are implemented with thick gate transistors.

4. The memory device of claim 1 wherein the antifuse element is a thin gate NMOS transistor having its source and drain tied together and a gate oxide that decreases in resistance after bitcell programming.

5. The memory device of claim 1 wherein post-breakdown current is inhibited from unintended leaking by the N well of the antifuse element.

6. The memory device of claim 1 wherein the N Well is shared with all bitcells within a row of the array.

7. The memory device of claim 1 further comprising at least one of:
column select circuitry for selecting a column of the array; and
row select circuitry for selecting a row of the array.

8. The memory device of claim 1 wherein the voltage divider is tunable.

9. A memory device, comprising:
an array of bitcells, each bitcell having two elements including a single antifuse element for storing a bitcell state and a single access element for providing access to the antifuse element for bitcell programming and readout; and
sense circuitry for sensing bitcell state during readout, and including a voltage divider operatively coupled to a transmission gate serially coupled to a skewed inverter, wherein during readout a voltage divided signal from the voltage divider is passed through the transmission gate to the skewed inverter and a high or low value is provided at the inverter output;

wherein the access element is a PMOS transistor and the antifuse element is an NMOS transistor having its source and drain tied together; and wherein post-breakdown current is inhibited from unintended leaking by an N Well surrounding +N source and drain regions of the antifuse element.

10. The memory device of claim 9 wherein the access element is a thick gate PMOS transistor, and the antifuse element is a thin gate NMOS transistor, and each of the voltage divider and transmission gate are implemented with thick gate transistors.

11. The memory device of claim 9 wherein the N Well is shared with multiple bitcells of the array.

12. The memory device of claim 9 further comprising:
power select circuitry for biasing a gate line of the array to a first voltage level for bitcell programming and a second voltage level for bitcell readout, the gate line connected to at least one of the antifuse elements.

13. The memory device of claim 9 further comprising at least one of:
column select circuitry for selecting a column of the array; and
row select circuitry for selecting a row of the array.

14. The memory device of claim 8 wherein at least one of the column select circuitry, row select circuitry, sense circuitry, and/or power select circuitry comprises level shifter circuitry for adjusting voltage levels between a nominal voltage domain and a high voltage domain.

15. The memory device of claim 10 further comprising:
row select circuitry for selecting a corresponding row of the array, the row select circuitry comprising, for each row, a level shifter for adjusting a corresponding row select signal from a nominal voltage domain level to a high voltage domain level that is applied to gates of the thick gate PMOS transistor access elements of that corresponding row; and
column select circuitry for selecting a corresponding column of the array, the column select circuitry comprising, for each column, a thick gate PMOS transistor having its gate driven by a level shifter, the level shifter for adjusting a corresponding column select signal from the nominal voltage domain level to the high voltage domain level.

16. A system, comprising:
a memory device comprising:
an array of bitcells, each bitcell having two elements including a single antifuse element for storing a bitcell state and a single access element for providing access to the antifuse element for bitcell programming and readout, wherein the antifuse element is an NMOS transistor configured with an N Well surrounding +N source and drain regions and its source and drain tied together;
power select circuitry for biasing a gate line of the array to a first voltage level for bitcell programming and a second voltage level for bitcell readout, the gate line connected to at least one of the antifuse elements; and
sense circuitry for sensing bitcell state during readout, and including a voltage divider operatively coupled to a transmission gate serially coupled to a skewed inverter, wherein during readout a voltage divided signal from the voltage divider is passed through the transmission gate to the skewed inverter and a high or low value is provided at the inverter output; and
a processor for accessing the memory device.

17. The system of claim 16 wherein the access element is a MOS transistor and the antifuse element is a MOS transistor having its source and drain tied together.

18. The system of claim 16 wherein the access element is a thick gate PMOS transistor, and each of the voltage divider and transmission gate are implemented with thick gate transistors.

19. The system of claim 16 wherein the antifuse element is a thin gate NMOS transistor having its source and drain tied together and a gate oxide that decreases in resistance after bitcell programming.

20. The system of claim 16 wherein post-breakdown current is inhibited from unintended leaking by the N well of the antifuse element.

21. The system of claim 16 wherein the N Well is shared with all bitcells within a row of the array.

22. The system of claim 16 further comprising at least one of:
column select circuitry for selecting a column of the array; and
row select circuitry for selecting a row of the array.

23. The system of claim 22 wherein:
the access element is a thick gate PMOS transistor, and the antifuse element is a thin gate NMOS transistor;
each of the voltage divider and transmission gate are implemented with thick gate transistors, and the transmission gate further comprises a level shifter for providing a control signal to the transmission gate;
the column select circuitry comprises, for each column, a thick gate PMOS transistor having its gate driven by a level shifter; and
the row select circuitry comprises, for each row, a level shifter;
wherein each level shifter is for adjusting voltage levels between a nominal voltage domain and a high voltage domain.

* * * * *

UNITED STATES PATENT AND TRADEMARK OFFICE
CERTIFICATE OF CORRECTION

PATENT NO. : 8,395,923 B2  Page 1 of 1
APPLICATION NO. : 12/639446
DATED : March 12, 2013
INVENTOR(S) : Zhanping Chen et al.

It is certified that error appears in the above-identified patent and that said Letters Patent is hereby corrected as shown below:

In the Claims

In column 13, line 29, in claim 14, delete "claim 8" and insert -- claim 13 --, therefor.

Signed and Sealed this
Eleventh Day of June, 2013

Teresa Stanek Rea
*Acting Director of the United States Patent and Trademark Office*